(12) United States Patent
Wei et al.

(10) Patent No.: US 11,710,620 B2
(45) Date of Patent: Jul. 25, 2023

(54) SEMICONDUCTOR PROCESS CHAMBER WITH HEAT PIPE

(71) Applicant: Taiwan Semiconductor Manufacturing Co., Ltd., Hsinchu (TW)

(72) Inventors: Kai-Chin Wei, Hsinchu (TW); Che-fu Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 435 days.

(21) Appl. No.: 17/081,802

(22) Filed: Oct. 27, 2020

(65) Prior Publication Data

US 2021/0134565 A1 May 6, 2021

Related U.S. Application Data

(60) Provisional application No. 62/928,072, filed on Oct. 30, 2019.

(51) Int. Cl.
| | |
|---|---|
| *H01L 21/67* | (2006.01) |
| *H01J 37/32* | (2006.01) |
| *C23C 16/50* | (2006.01) |
| *C23C 16/52* | (2006.01) |
| *H01L 21/02* | (2006.01) |

(52) U.S. Cl.
CPC ........ *H01J 37/32522* (2013.01); *C23C 16/50* (2013.01); *C23C 16/52* (2013.01); *H01J 37/32651* (2013.01); *H01J 37/32715* (2013.01); *H01L 21/02164* (2013.01); *H01L 21/02274* (2013.01); *H01L 21/67109* (2013.01); *H01L 21/67248* (2013.01); *H01J 2237/3321* (2013.01)

(58) Field of Classification Search
CPC ....... C23C 16/463; C23C 16/46; C23C 16/52; H01L 21/02274; H01L 21/67248; H01L 21/6719; H01L 21/67109; H01L 21/67103
See application file for complete search history.

(56) References Cited

U.S. PATENT DOCUMENTS

| | | | |
|---|---|---|---|
| 5,894,887 A | 4/1999 | Kelsey et al. | |
| 7,897,205 B2 | 3/2011 | Kameshima et al. | |
| 8,950,469 B2* | 2/2015 | Sasaki | H01L 21/67248 165/266 |
| 2002/0092166 A1* | 7/2002 | Jacobs | B23P 15/26 29/890.032 |
| 2004/0163597 A1* | 8/2004 | Lee | C23C 16/4411 118/724 |

FOREIGN PATENT DOCUMENTS

CN 101061575 A 10/2007

* cited by examiner

*Primary Examiner* — Jaehwan Oh
(74) *Attorney, Agent, or Firm* — Seed IP Law Group (57) ABSTRACT

A semiconductor processing system processes semiconductor wafers in a process chamber. The process chamber includes semiconductor process equipment for performing semiconductor processes within the chamber. The process chamber includes a heat pipe integrated with one or more components of the process chamber. The heat pipe effectively transfers heat from within the chamber to an exterior of the chamber.

20 Claims, 10 Drawing Sheets

SEMICONDUCTOR PROCESS CHAMBER WITH HEAT PIPE

BACKGROUND

Semiconductor wafers are processed in semiconductor processing facilities. Semiconductor wafers undergo a large number of processes including thin-film depositions, photo resist patterning, etching processes, dopant implantation processes, annealing processes, and other types of processes. Many of these processes are performed in semiconductor process chambers. In order to achieve uniform results in the various semiconductor processes, it is beneficial to maintain the temperature in the semiconductor process chambers within a selected range.

However, it can be difficult to control the temperature within a semiconductor process chamber. Semiconductor processes often utilize heaters to elevate the temperature within the semiconductor process chamber. However, it can be difficult to dissipate enough heat from the semiconductor process chamber to ensure that the temperature in the semiconductor process chamber does not rise above a selected level or outside of a selected range. If the temperature is not well-controlled within the semiconductor process environment, it is possible that semiconductor wafers will have poor uniformity, have undesirable performance characteristics, or may need to be entirely scrapped.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
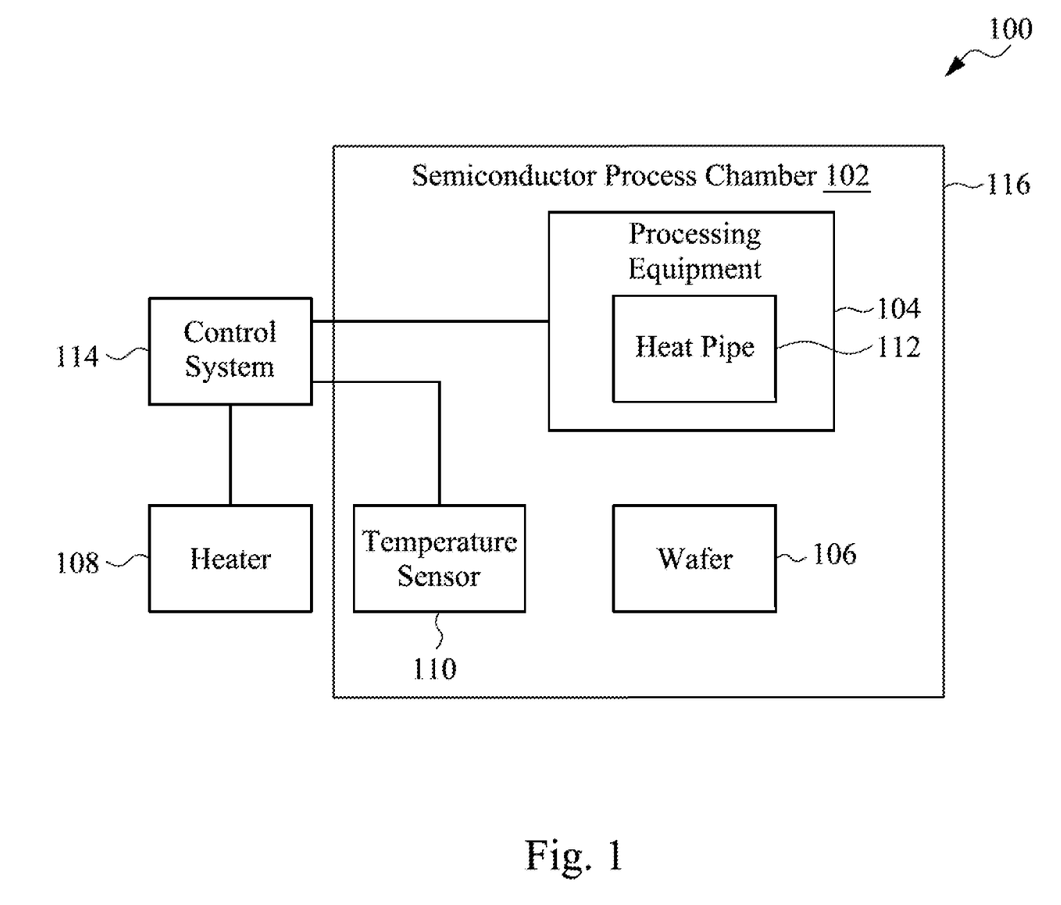
FIG. 1 is a block diagram of a semiconductor process system, in accordance with some embodiments.

FIG. 1 is a block diagram of a semiconductor process system 100, according to one embodiment. The semiconductor process system 100 includes a semiconductor process chamber 102 and a control system 114. The semiconductor process chamber 102 has an interior volume 103. Processing equipment 104 is positioned at least partially within the semiconductor process chamber 102. A wafer 106 and a temperature sensor 110 are positioned within the interior volume 103. A heater 108 is positioned outside the semiconductor process chamber 102. The processing equipment 104 includes a heat pipe 112. The semiconductor process chamber 102 includes a wall 116 that defines, at least partially, the interior volume 103.

In one embodiment, the semiconductor process chamber 102 is configured to perform one or more semiconductor processes on the wafer 106. The wafer 106 is a semiconductor wafer. Typically, semiconductor wafers undergo a large number of processes during fabrication. These processes can include thin-film depositions, photoresist patterning, etching processes, dopant implantation processes, annealing processes, and other types of processes. After all of the processing steps are complete, the wafer 106 will be diced into a plurality of individual integrated circuits.

In one embodiment, the semiconductor process chamber 102 is a thin film deposition chamber. The thin-film deposition chamber can include a chemical vapor deposition chamber, a sputtering chamber, a physical vapor deposition chamber, an atomic layer deposition chamber, a plasma enhanced vapor deposition chamber, an epitaxial growth chamber, or other types of thin-film deposition chambers. Those of skill in the art will recognize, in light of the present disclosure, that the semiconductor process chamber 102 can include a thin-film deposition chamber other than those described above without departing from the scope of the present disclosure.

In one embodiment, the semiconductor process chamber 102 is an etching chamber. The etching chamber is utilized to etch thin films deposited on the wafer 106. The etching chamber can include a chamber for wet etching, dry etching, plasma etching, or other types of etching processes. Etching chambers other than those described above can be utilized without departing from the scope of the present disclosure.

In one embodiment, the semiconductor process chamber 102 is a dopant implantation chamber. The dopant implantation chamber can include an ion implantation chamber in which the wafer 106 is bombarded with dopant ions. The dopant ions are implanted within the wafer 106 in accordance with selected parameters for the ion implantation process. The dopant implantation chamber can include types of dopant implantation other than those described above without departing from the scope of the present disclosure.

The semiconductor process chamber 102 includes processing equipment 104. The processing equipment 104 assists in performing the semiconductor processes. The processing equipment 104 can include equipment that assists in thin-film deposition processes, etching processes, ion implantation processes, annealing processes, photolithography processes, and other types of processes. Some of the processing equipment 104 may be positioned entirely within the semiconductor process chamber 102. Some of the processing equipment 104 may be positioned partially within the semiconductor process chamber 102 and partially external to the semiconductor process chamber 102. Some of the processing equipment 104 may be positioned entirely external to the semiconductor process chamber 102.

The processing equipment 104 can include electrical components for generating electric fields, voltages, magnetic fields, electrical signals, or other types of electrical effects. Accordingly, the processing equipment 104 can include electrodes, wires, radiofrequency power sources, transmitters, receivers, or other types of electrical equipment that may be utilized in semiconductor processes.

The processing equipment 104 can include equipment for managing gas or flow within the semiconductor process chamber 102. The processing equipment can include components for introducing gasses or fluids into the semiconductor process chamber 102, for removing gasses or fluids from the semiconductor process chamber, for monitoring and controlling the flow, presence, or composition of gasses within the process chamber 102.

The processing equipment 104 can include protective equipment for shielding a portion of the interior volume 103 during semiconductor processes. For example, the processing equipment 104 can include a deposition shield or types of protective equipment.

In some semiconductor processes, it is desirable to maintain the temperature within the semiconductor processing chamber 102 within a selected range. In some cases, a heater 108 may be employed to heat the semiconductor process chamber 102, or the wafer 106, to a selected temperature. However, in some cases, the semiconductor process can generate excess heat that can result in a temperature higher than the selected range. In these circumstances, it can be difficult to maintain a selected temperature range using traditional techniques.

In one embodiment, in order to assist in controlling the temperature within the semiconductor process chamber 102, the processing equipment 104 includes a heat pipe 112. The heat pipe 112 facilitates conducting heat from an interior of the semiconductor process chamber 102 to the exterior of the semiconductor process chamber 102. Accordingly, the heat pipe 112 provides increased ability to transfer heat from within the semiconductor process chamber 102 to an exterior of the semiconductor process chamber 102. This in turn enables tighter control of temperatures within the semiconductor process chamber 102. The temperature sensor 110 senses the temperature within the semiconductor process chamber 102 and passes the temperature signals to the control system 114. The control system 114 controls the operation of the heater responsive to the temperature signals from the temperature sensor 110. In particular, the heater 108 can be operated with reduced risk that the heater 108 will generate more heat than can be dissipated from within the semiconductor process chamber 102. Accordingly, if the temperature within the semiconductor process chamber 102 exceeds a selected temperature range or temperature threshold, the output of the heater 108 can be reduced and the heat pipe 112 can quickly convey heat from the semiconductor process chamber 102 such that the temperature quickly returns to the selected temperature range. In this way, the temperature within the semiconductor process chamber 102 can be maintained within a selected temperature range during semiconductor processes.

Semiconductor processing equipment within a semiconductor process chamber often includes various metal components. The metal components are selected to be sufficiently robust to withstand conditions within the semiconductor process chamber. The metal components can be selected to withstand high temperatures, vacuum conditions, strong electric fields, strong magnetic fields, and particle bombardment.

In one embodiment, one or more heat pipes 112 are coupled to one or more of the metal components within the semiconductor process chamber 102. The heat pipes 112 are in physical contact with one or more of the metal components within the semiconductor process chamber 102. The heat pipes 112 receive heat from the one or more metal components and transfer heat away from the one or more metal components.

In one embodiment, the one or more heat pipes 112 extend between the one or more metal components and an exterior of the semiconductor process chamber 102. By processes that will be explained in more detail below, the heat pipes 112 transfer heat from the one or more metal components within the semiconductor process chamber 102 to an exterior of the semiconductor process chamber 102. The one or more heat pipes 112 can be connected to a heat sink or another type of physical object external to the semiconductor process chamber 102. The one or more heat pipes transfer heat from the one or more metal components within the semiconductor process chamber 102 to the one or more physical objects external to the semiconductor process chamber 102.

In one embodiment, the one or more heat pipes 112 transfer heat from the one or more metal components within the semiconductor process chamber 102 to another area within the semiconductor process chamber 102. In other words, the heat pipes 112 can transfer heat from one area of the semiconductor process chamber 102 to another area of the semiconductor process chamber 102. In these situations, there may be particular areas or components of the semiconductor process chamber 102 from which heat needs to be transferred. The heat receiving areas can be areas that can absorb more heat or that are connected to other cooling systems that can transfer heat to an exterior of the semiconductor process chamber 102.

In one embodiment, one or more traditional metal components of a semiconductor process chamber 102 include a heat pipe 112. Accordingly, a portion of the traditional metal components of the semiconductor process chamber 102 can be replaced with a heat pipe 112. Additionally, or alternatively, an entire metal component can be replaced with a heat pipe 112. The heat pipe 112 can have a shape and structure that performs the function of the traditional metal component that the heat pipe 112 replaces. The heat pipe 112 can also be sufficiently robust to withstand high temperatures, vacuum conditions, strong electric fields, strong magnetic fields, particle bombardment, and other conditions that may be present within the semiconductor process chamber 102. The heat pipe 112 can provide the additional benefit of facilitating the transfer of heat from an interior of the semiconductor process chamber 102 to an exterior of the semiconductor process chamber 102.

In one embodiment, the heat pipe 112 is part of the wall 116 of the semiconductor process chamber 102. The wall 116 can define, at least in part, the interior volume 103 of the semiconductor process chamber 102. The wall 116 can include one or more heat pipes 112. The one or more heat pipes 112 conduct heat from the interior of the semiconductor process chamber 102 to an exterior of the semiconductor process chamber 102.

In one embodiment, the wall 116 is a heat pipe 112, or a group of heat pipes 112. An interior surface of the wall 116 corresponds to a heat receiving area of the one or more heat pipes. An exterior surface of the wall 116 corresponds to a heat dissipation area of the one or more heat pipes 112. Accordingly, the heat pipes 112 transfer heat received at the interior surface of the wall 116 to an exterior surface of the wall 116. In this way, the heat pipe 112 dissipates heat from an interior of the semiconductor process chamber 102 to an exterior of the semiconductor process chamber 102.

In one embodiment, the heat pipe 112 is a heat transfer device that combines the principles of both thermal conductivity and phase transition to effectively transfer heat between two interfaces. The heat pipe 112 includes an interior volume that holds a working fluid. The heat pipe 112 operates by transferring heat to the working fluid at a heat receiving area and dissipating heat from the working fluid at a heat dissipation area. The working fluid transfers heat from the heat receiving area to the heat dissipation area. Accordingly, the heat pipe 112 includes a hot interface and a cool interface. The hot interface corresponds to the heat receiving area or the area to be cooled. The cool interface corresponds to the heat dissipation area or the area to which heat will be transferred from the hot interface via the working fluid.

In one embodiment, the heat pipe 112 operates by turning the working fluid from a liquid to a gas or vapor at the hot interface by transferring heat to the working fluid. The heat pipe 112 further operates by turning the working fluid from a gas or vapor to a liquid by transferring heat from the working fluid at the cool interface. More particularly, as the working fluid circulates through the interior channel, the working fluid enters the heat receiving area or approaches the hot interface in a liquid state. Heat is then transferred to the working fluid at the heat receiving area or the hot interface and the working fluid boils or vaporizes. The gaseous working fluid then flows through a channel toward the heat dissipation area or cool interface. At the heat dissipation area or cool interface, the gaseous working fluid dissipates heat until the working fluid condenses into liquid form. The liquid working fluid is then absorbed by a wicking material within the heat pipe by capillary action. The liquid working fluid flows through the wicking material back toward the hot interface or heat receiving area. The liquid working fluid then continues to circulate through the channel toward the receiving area again. In this way, the heat pipe 112 transfers heat from the receiving area to the heat dissipation area. This operation of the heat pipe 112 can effectively transfer heat from an interior of the semiconductor process chamber 102 to an exterior of the semiconductor process chamber 102. Alternatively, or additionally, the heat pipe can effectively transfer heat from one area of the interior of the semiconductor process chamber 102 to another area of the interior of the semiconductor process chamber 102.

Figure 2A:
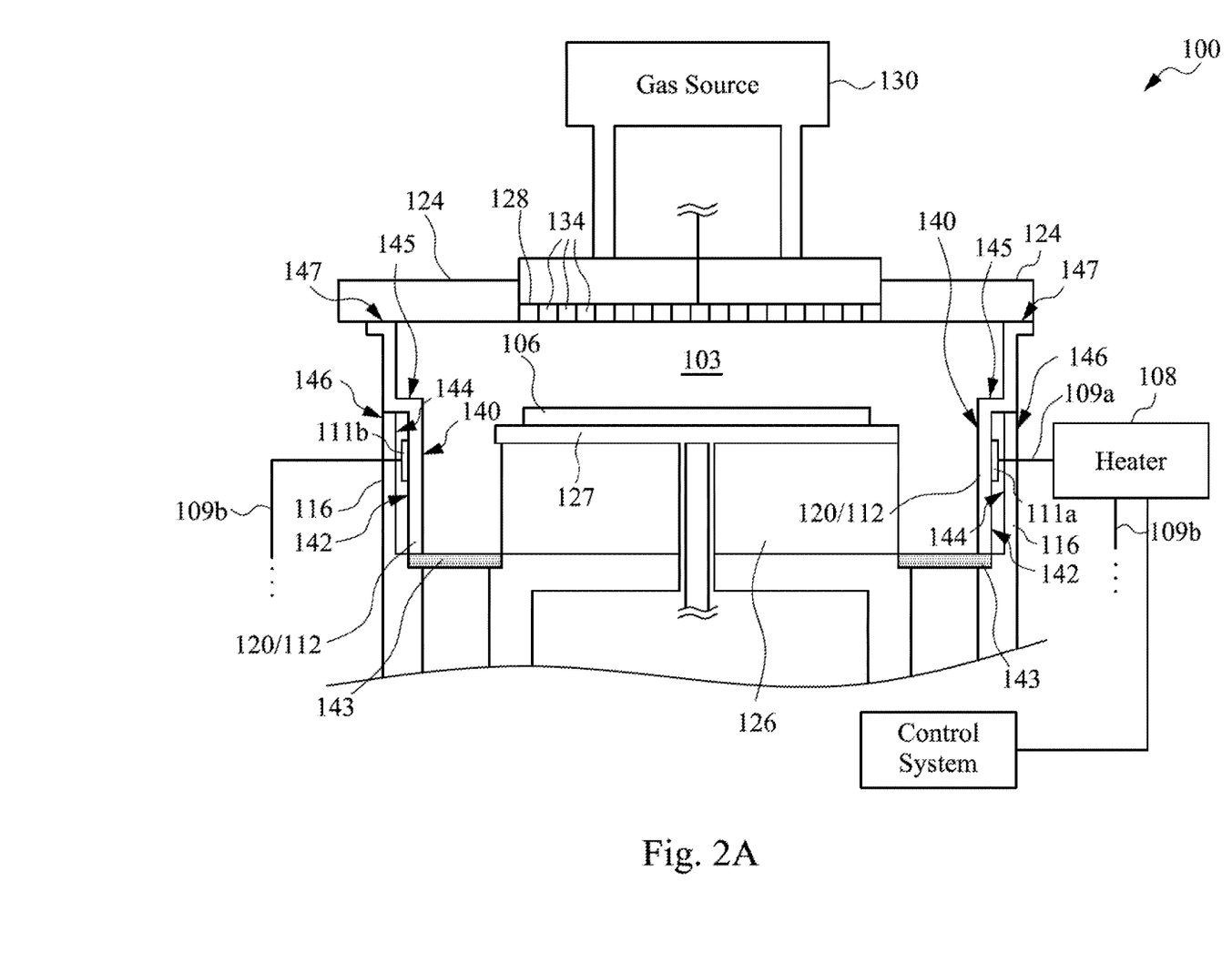
FIG. 2A is a side sectional view of a semiconductor process system including a deposition shield formed as a heat pipe, in accordance with some embodiments.

FIG. 2A is an illustration of a semiconductor process system 100, according to one embodiment. The semiconductor process system 100 includes a semiconductor process chamber 102. The semiconductor process chamber 102 includes an interior volume 103. The semiconductor process chamber 102 further includes a wafer support 126 configured to hold a wafer 106.

In the example FIG. 2A, the semiconductor process system 100 is a plasma enhanced chemical vapor deposition (PECVD) system. The plasma enhanced chemical vapor deposition system can be utilized to deposit dielectric layers on the wafer 106. The dielectric layers can include silicon oxides, silicon nitride, or other types of dielectric layers. The semiconductor process system 100 can be utilized to deposit other types of layers or to perform other types of semiconductor processes than those described above without departing from the scope of the present disclosure.

In one embodiment, the semiconductor processing system 100 includes a bottom electrode 127, a top electrode 128, and a gas source 130. In the example of FIG. 2, the top electrode 128 is a showerhead type electrode including a plurality of vent holes 134 that enable gas to flow from the gas source 130 into the interior volume 103. The top electrode 127 and the bottom electrode 128 are coupled to a radio frequency power source. The radio frequency power source can be coupled to or can be part of the control system 114.

During a PECVD process, deposition gasses are passed from the gas source 130 into the interior volume 103 via the vents 134 of the top electrode 128. The radiofrequency power source generates a plasma from the deposition gasses within the interior volume 103 by applying a voltage between the bottom electrode 127 and the top electrode 128. The plasma enhances deposition of a thin-film on the wafer 106. In one embodiment, the semiconductor process chamber 102 includes a deposition shield 120. The deposition shield 120 is placed within the interior volume 103 surrounding the wafer support 126 and the wafer 106. The deposition shield 120 rests on the chamber wall 116. The deposition shield 120 can be lowered into the interior volume 103 when the lid 124 is raised or removed. The shape of the deposition shield 120 can be further understood in light of FIGS. 2B and 2C, as described in further detail below. The deposition shield 120 can include an exhaust grating 143. The exhaust grating 143 can include apertures or pores that enable exhaust gases from the deposition process to pass from the interior volume 103 of the deposition chamber. The exhaust grating 143 can be an integral part of the deposition shield 120 or can be a separate part that is connected to the deposition shield 120.

In one embodiment, the deposition shield 120 prevents the buildup of material on the wall 116 of the semiconductor process chamber 102. For example, during an etching or deposition process, it is possible that etched material or material supplied into the interior volume 103 can build up on the interior surface of the wall 116. In order to prevent this buildup, the semiconductor process chamber 102 includes the deposition shield 120. The deposition shield 120 can be easily removed and replaced, or removed and cleaned after each semiconductor process.

In some cases, it is desirable to maintain the temperature of the wafer 106 within a selected temperature range during deposition processes. The heater 108 can be operated to provide heat to the interior volume 103. In particular heater pads 111*a*, 111*b* can be coupled to the deposition shield 120. The heater pads 111*a*, 111*b* can include resistive elements. A current can be passed to the heater pads 111*a*, 111*b* via electrical leads 109*a*, 109*b*. When the current passes through the resistive elements of the heater pads 111*a* and 111*b*, the resistive elements generate heat, which is passed to the interior volume via the deposition shield 120. Accordingly, the heater pads 111a and 111b can be considered part of the heater 108. Many other types of heaters can be utilized without departing from the scope of the present disclosure.

In the example of a low temperature PECVD process for depositing a silicon oxide layer on the wafer 106, it may be desirable to maintain the temperature of the interior volume 103 between 50° C. and 70° C. Accordingly, the control system 114 may operate the heater 108 intermittently or continuously to heat the wafer 106. However, in some cases the PECVD process may result in the generation of excess heat that can heat the interior volume to temperatures beyond the desired temperature range. This can result in a faulty deposition of the silicon oxide layer.

In order to facilitate the rapid dissipation of heat from the interior volume 103, the deposition shield 120 includes a heat pipe structure. The heat pipe structure transfers heat from an interior volume surrounded by the deposition shield 120 to an exterior of the deposition shield 120. Thus, the deposition shield 120 is a heat pipe 112. The deposition shield 120 includes a first surface 140 and a second surface 142. The first surface 140 can be considered an interior surface. The second surface 142 can be considered an exterior surface.

In one embodiment, the deposition shield is a flat heat pipe. The flat heat pipe includes a vapor chamber between the first surface 140 and the second surface 142. As will be described in more detail with relation to FIGS. 3A and 3B, the vapor chamber transfers heat from the first surface 140 to the second surface 142.

The deposition shield 120 can include a top surface 147 and a step surface 145. The deposition shield 120 has a shape that enables the deposition shield 112 to be lowered into the process chamber 102 and to be stably supported by the chamber wall 116. The deposition shield 120 can be removed from the process chamber 102 and cleaned between deposition processes or after a certain number of deposition processes. The deposition shield 120 can have a shapes and components other than those described above without departing from the scope of the present disclosure.

The lid 124 rests on the top surface 147 of the deposition shield 120. In FIG. 2A, the lid 124 is shown as a single component. However, in practice, the lid 124 may include various components that couple together, to the deposition shield 120, and to the top electrode 128.

In one embodiment, the wall 116 includes an interior surface 144 and an exterior surface 146. The wall 116 can be cylindrical. The cylindrical chamber wall can surround the deposition shield 120 and can, in part, define the interior volume 103.

In one embodiment, the wall 116 includes a heat pipe structure. The heat pipe structure transfers heat from an interior volume surrounded by the wall 116 to an exterior of the wall 116. Accordingly, the wall 116 can be a heat pipe 112. The heat pipe 112 can include a vapor chamber between the interior surface 144 and the second surface 146. The vapor chamber transfers heat from the interior wall 144 to the exterior wall 146.

Though not shown in FIG. 2A, the semiconductor process chamber 102 can include other types of heat pipes 112 than those described above. The other types of heat pipes 112 can include types of heat pipes other than flat vapor chamber pipes, as will be described in more detail below.

Figure 2B:
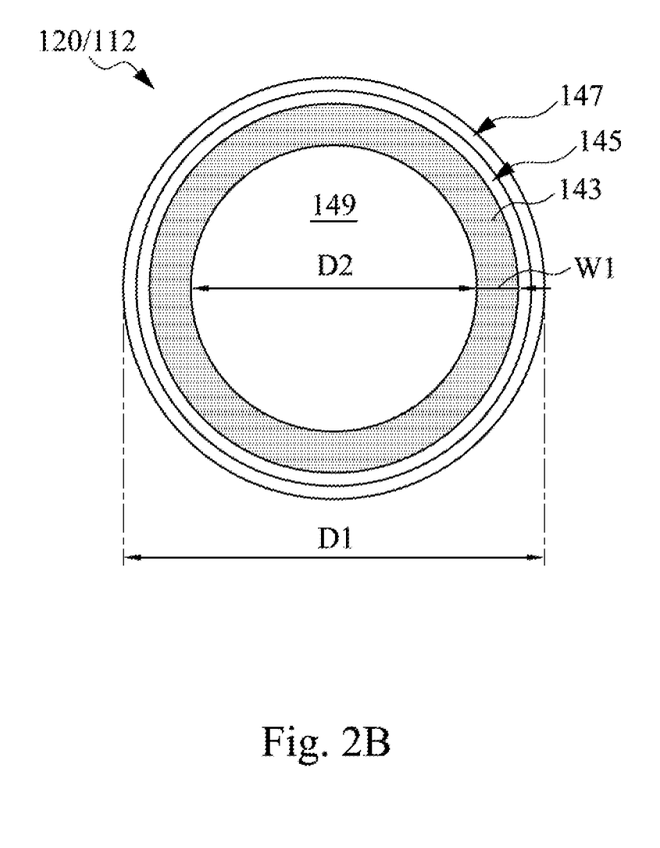
FIG. 2B is a top view of the deposition shield of FIG. 2A, according to one embodiment.

FIG. 2B is a top view of the deposition shield 120 of FIG. 2A, according to one embodiment. The top view of FIG. 2B illustrates the generally annular shape of the deposition shield 120. The exhaust grating 143 at the bottom of the deposition shield 120 defines an opening 149. When the deposition shield 120 is lowered into the deposition chamber, the opening 149 surrounds the wafer support 126.

The deposition shield 120 has an outer diameter D1. The outer diameter D1 corresponds to the diameter of the top surface 147 of the deposition shield 120. The diameter D1 can have a range between 340 mm and 400 mm. The diameter D1 of the deposition shield 120 can have other values without departing from the scope of the present disclosure. The deposition shield 120 has an inner diameter at the top surface 147 that, in some embodiments, is less than 400 mm or less than 340 mm. The inner diameter of the deposition shield 120 at the top surface 147 can have other values without departing from the scope of the present disclosure. The deposition shield 120 has outer diameter at the step surface that is less than the outer diameter D1 and greater than the inner diameter of the deposition shield 120 at the top surface 147. The deposition shield 120 has an inner diameter at the step surface (i.e., at inner surface 140) that is less than the inner diameter of the deposition shield at the top surface 147 and less than the outer diameter of the deposition shield at surface 142. In some embodiments, the inner diameter of the deposition shield 120 at inner surface 140 is less than 330 mm or less than 310 mm. The inner diameter of the deposition shield 120 at the inner surface 140 can have other values without departing from the scope of the present disclosure.

The opening 149 has a diameter D2. The diameter D2 is defined by the inner edge of the exhaust grating 143. The diameter D2 can have a range between 310 mm and 330 mm. The diameter D2 can have other values without departing from the scope of the present disclosure. The exhaust grating 143 can have a width W1. The width W1 can have a value between 20 mm and 50 mm. The width W1 can have other values without departing from the scope of the present disclosure.

Figure 2C:
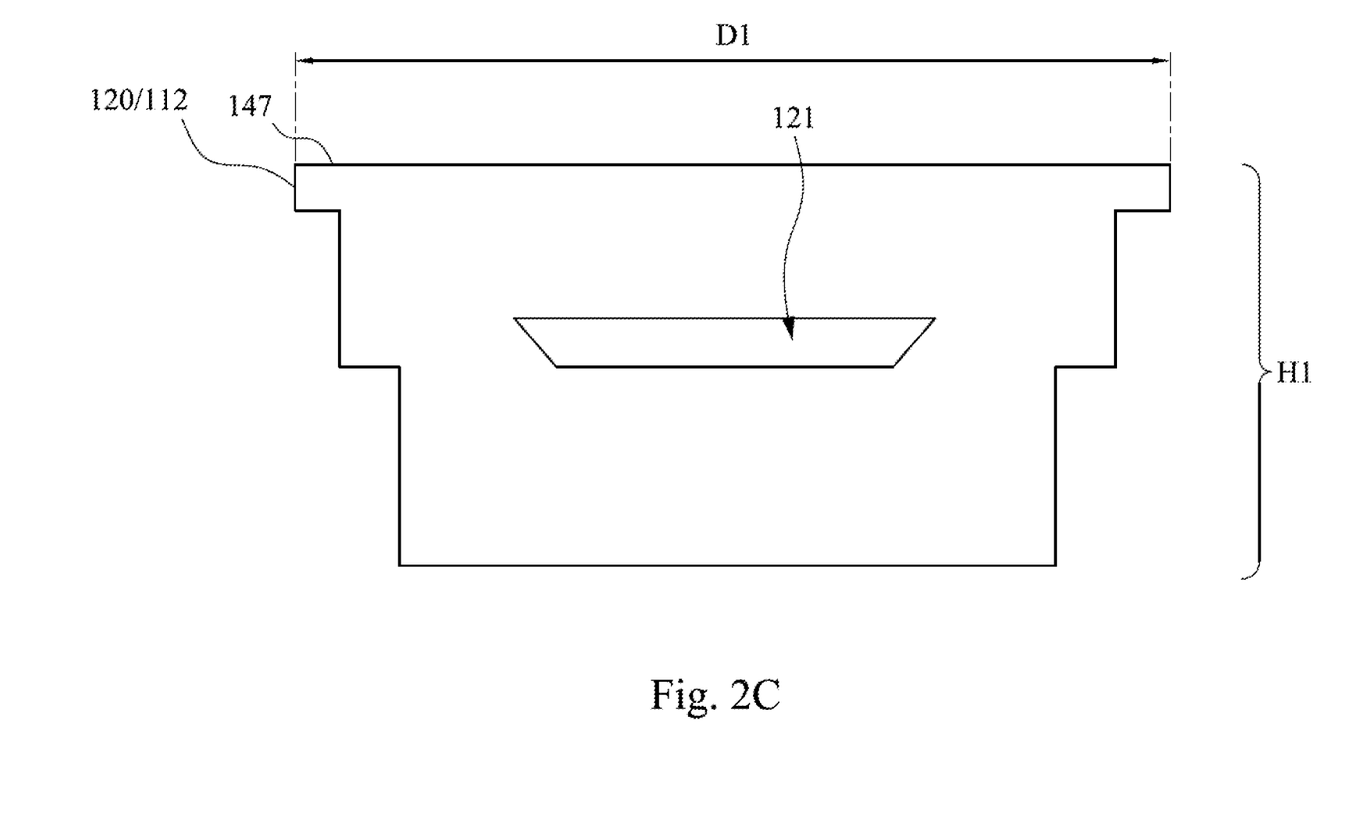
FIG. 2C is a side view of the deposition shield of FIG. 2A, according to one embodiment.

FIG. 2C is a side view of the deposition shield 120 of FIG. 2A, according to one embodiment. The side view of FIG. 2C illustrates a slot 121 in the deposition shield 120. When the deposition shield 120 is positioned in the deposition chamber, a wafer 106 can be placed on the wafer support 126 by passing the wafer 106 through the slot 121. The wall 116 of the deposition chamber can also include an opening or port by which the wafer can be passed through the slot 121 from outside of the deposition chamber. The deposition shield 120 can have other shapes and configurations without departing from the scope of the present disclosure.

The deposition shield 120 has a total height H1. The height H1 corresponds to the distance between the top surface 147 and the bottom of the exhaust grating 143. In some embodiments, the height H1 can have a value between 200 mm and 300 mm. The height H1 can have other values without departing from the scope of the present disclosure.

Figure 2D:
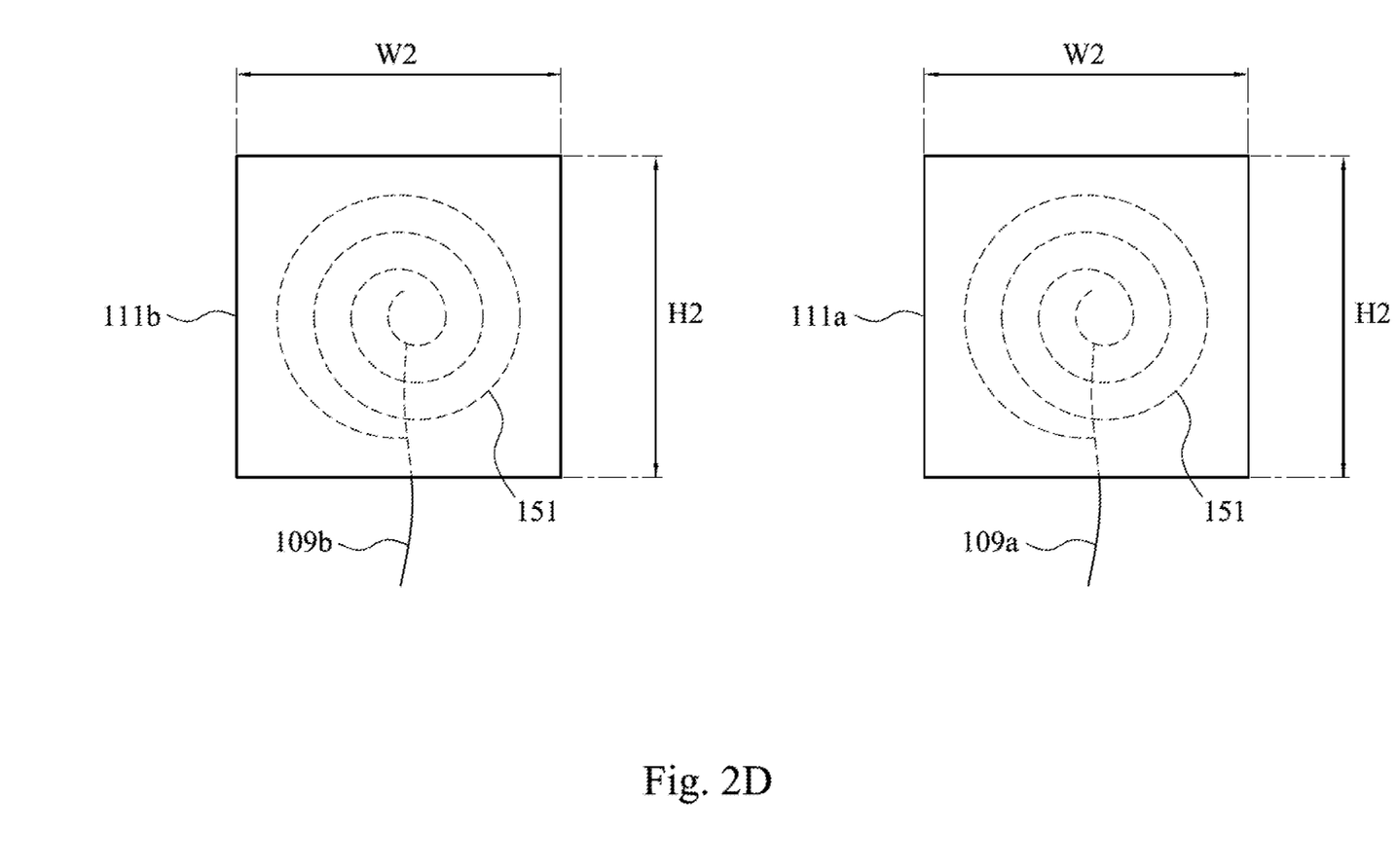
FIG. 2D is an illustration of heater pads, according to one embodiment.

FIG. 2D is an illustration of heater pads 111a and 111b, according to one embodiment. For clarity purposes, in FIG. 2D, the heater pads 111a and 111b are not shown coupled to the deposition shield 120. When in use, the heater pads 111a and 111b are coupled to opposite sides of the outer surface 142 of the deposition shield 120 as shown in FIG. 2A. In other embodiments, more than two heater pads are coupled to the deposition shield 120.

Each heater pad 111a and 111b has a height H2 and a width W2. In some embodiments, the height H2 can be between 80 mm and 150 mm and the width W2 can be between 80 mm and 150 mm. Other values for the height H2 and the width W2 can be utilized without departing from the scope of the present disclosure.

Figure 3A:
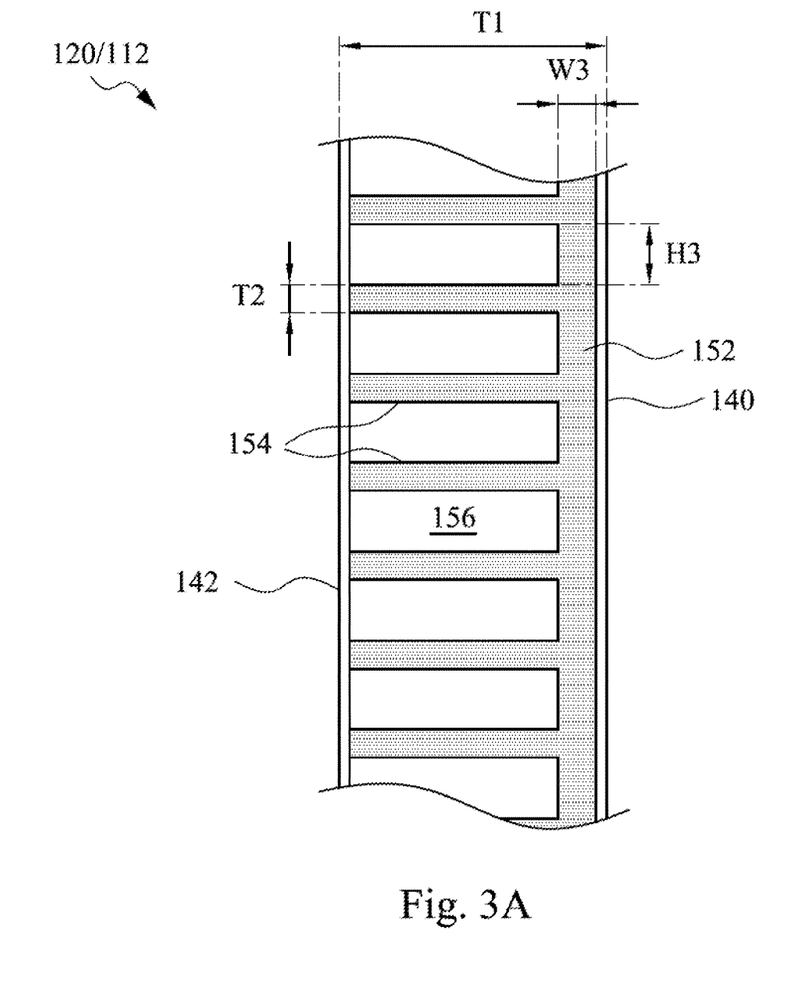
FIGS. 3A and 3B are illustrations of a vapor chamber type heat pipe, in accordance with some embodiments.

Each heater pad 111a, 111b has a heating element 151. In one example, the heating element 151 is an electrically resistive coil. The electrically resistive coil generate heat when the current is passed through the electrically resistive coil. The electrically resistive coils are coupled to the respective electrical leads 109a and 109b. In one example, each heater pad 111a, 111b consumes between 400 W and 600 W of power when generating heat. Other types of heating elements and other values of power consumption can be utilized by the heater pads 111a and 111b without departing from the scope of the present disclosure. FIG. 3A is a cross-sectional view of a portion of the deposition shield 120 of FIGS. 2A-2C, according to one embodiment. In particular, FIG. 3A is an enlarged cross-sectional view that illustrates the internal structure of the deposition shield 120 between the interior surface 140 and the exterior surface 142. In particular, in one embodiment, the internal structure of the deposition shield 120 between the interior surface 140 and the exterior surface 142 is a heat pipe structure. The deposition shield 120 can be formed as a vapor chamber type heat pipe 112, according to one embodiment. Alternatively, or additionally, the heat pipe 112 of FIG. 3A can correspond to other types of processing equipment 104 that can be included in a semiconductor process chamber 102.

In one embodiment, the deposition shield 120 includes a wicking material 152 positioned between the first surface 140 and the second surface 142. In particular, the wicking material 152 is positioned along the first surface 140. The wicking material is configured to draw in liquid via capillary action. Once inside the wicking material 152, the liquid can travel through the wicking material 152, as will be described in more detail below. The wicking material 152 may also be positioned along the second surface 142.

In one embodiment, columns 154 of wicking material 152 extend between the first surface 140 and the second surface 142. The columns 154 of wicking material 152 may be coupled to support rods or posts extending between the first surface 140 and the second surface 142. The columns 154 of wicking material 152 may surround the support rods or posts. Accordingly, the support rods or posts are positioned within the columns of wicking material 152 and are not visible in the view of FIG. 3A. The support rods or posts may help prevent a collapse of the vapor chamber between the first surface 140 and the second surface 142.

In one embodiment, vapor channels 156 are positioned between the columns 154 of wicking material 152. The vapor channels 156 support a flow of vapor between the first surface 140 and the second surface 142, as will be described in more detail below. In one embodiment, the vapor channels 156 form a single continuous vapor channel surrounding the columns 154 of wicking material 152.

In one embodiment, the wicking material 152 is a sintered material. The sintered material may be a sintered metal. The sintered metal may include titanium, aluminum, iron, copper, or other types of metal. The sintered metal includes pores that can draw in liquids via capillary effect. The liquid can travel along the sintered metal through a network of pores. The sintered metal can be produced by generating a powder from the metal and impressing the metal powder together at temperatures lower than the melting point of the metal. The result is a porous metal that can draw in liquid via capillary action. Other materials and processes can be used for a sintered material without departing from the scope of the present disclosure In one embodiment, the wicking material 152 is a grooved material. For example, the columns 154 may include grooves extending along a length of the column in a direction between the second surface 142 and the first surface 140. The grooves can draw in liquid by capillary action. The liquid can then travel along the length of the grooves between the second surface 142 and the first surface 140. The grooved material can include metals such as titanium, aluminum, copper, iron, or other types of metal. The grooved material can include other types of metal or materials other than metal without departing from the scope of the present disclosure. The grooved material may also be a sintered material.

In one embodiment, the wicking material 152 includes wrapped screens. In this case, the wicking material includes screens that have a large number of pores. The screens are then wrapped up. The screens can draw in liquid via capillary action. Once inside the wicking material, the liquid can travel through a network of pores or apertures in the columns 154 between the second surface 142 and the first surface 140. The wicking material can include other types of wicking material other than screens, sintered material, or grooved material without departing from the scope of the present disclosure.

In one embodiment, the heat pipe 112 is between 2 mm and 50 mm in thickness. Accordingly, a deposition shield 120 configured as a flat vapor chamber type pipe wrapped in a cylinder can have a thickness similar to traditional deposition shields. Additionally, a flat vapor chamber type heat pipe can be utilized for other components of a semiconductor process chamber 102, without departing from the scope of the present disclosure.

In one embodiment, the heat pipe 112 includes a working fluid in the vapor chamber between the first surface 140 and the second surface 142. During operation of the heat pipe 112, the working fluid repeatedly transitions between gaseous and liquid states while circulating through the vapor chamber between the first surface 140 and the second surface 142. The working fluid can be selected based on the expected temperature range in the environment in which the heat pipe 112 will be placed. In one embodiment, for temperature ranges between −70° C. and 200° C., the working fluid can include water, Freon, $NH_3$, $CH_3COCH_3$, $CH_3OH$, $C_2H_5OH$, and $C_7H_{16}$. In one embodiment, for temperature ranges between 200° C. and 500° C., the working fluid can include naphthalene, Downtherm, Thermex, sulfur, and mercury. In one embodiment, for temperature ranges between 500° C. and 1000° C., the working fluid can include Cs, Rb, Kalium, and sodium. Other working fluids than those set forth above can be utilized for the various temperature ranges without departing from the scope of the present disclosure.

The deposition shield 120 has a thickness T1. The thickness T1 corresponds to the distance between the exterior surface 142 and the interior surface 140 of the deposition shield 120. The thickness T1 can have a value between 5 mm and 15 mm. Other thicknesses are possible without departing from the scope of the present disclosure.

The columns 154 have a thickness T2. The thickness T2 can have a value between 2 mm and 10 mm, though other values are possible without departing from the scope of the present disclosure.

The wicking material 152 adjacent to the interior surface 140 of the deposition shield 120 can have a width W3 at the locations between adjacent columns 154. The width W3 can have a value between 2 mm and 5 mm, though other values can be utilized without departing from the scope of the present disclosure.

The vapor channels 156 have a height H3. The height H3 corresponds to the distance between adjacent columns 154.

The height H3 can have a value between 5 mm and 10 mm, though other values of the height H3 can be utilized without departing from the scope of the present disclosure.

Figure 3B:
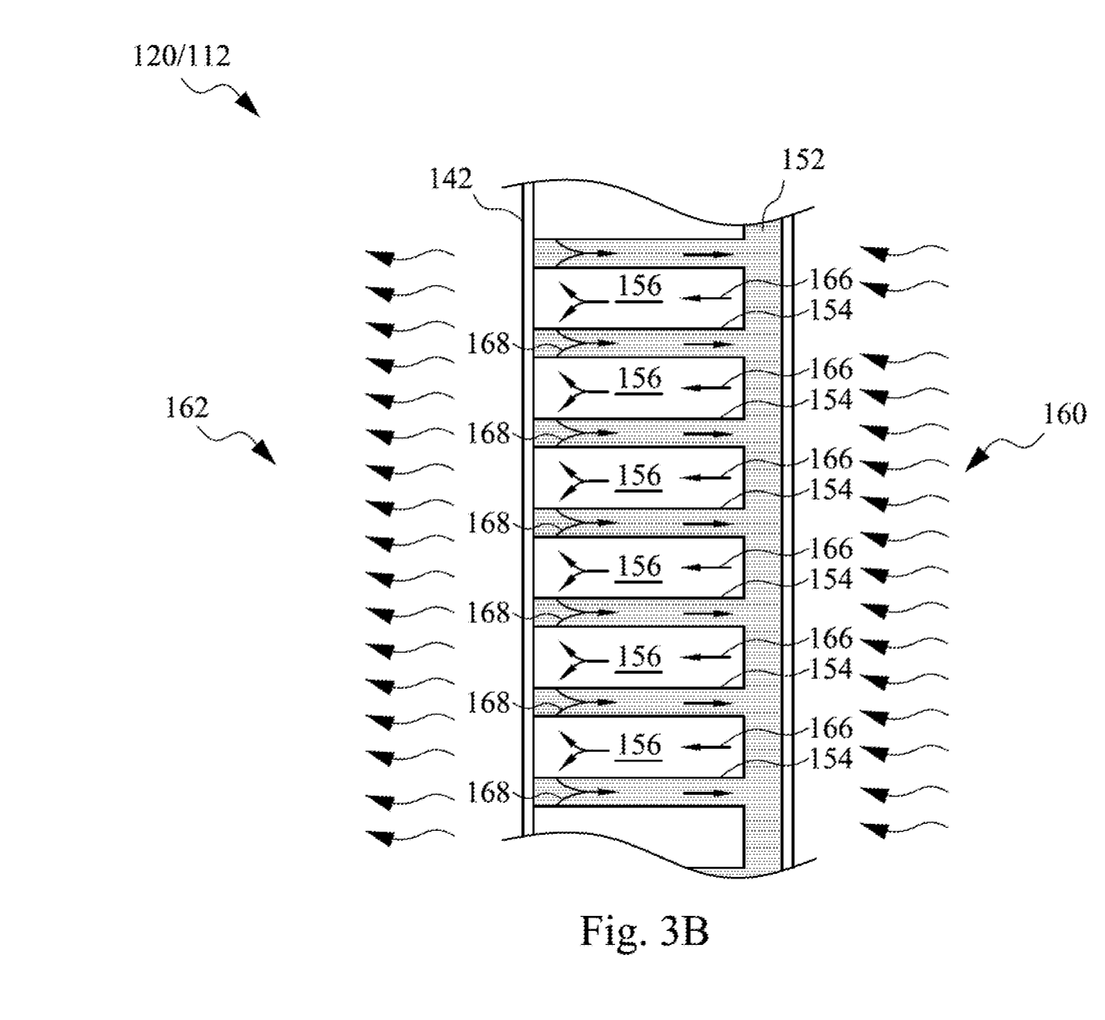

FIG. 3B is an annotated view of the deposition shield 120 of FIG. 3A illustrating operation of the heat pipe, according to one embodiment. In FIG. 3B, the first surface 140 is a hot surface or heat receiving side of the heat pipe 112. The second surface 142 is a cool surface or heat dissipation side of the heat pipe 112.

In one embodiment, heat 160 received by the heat pipe 112 is illustrated as wavy lines incident on the first surface 140 of the heat pipe 112. The heat pipe 112 absorbs the heat 160. Heat 162 dissipated by the heat pipe 112 is illustrated as wavy lines exiting the second surface 142. Though not shown in FIG. 3B, the heat pipe 112 may be in physical contact with a solid material on one or both surfaces 140, 142.

In one embodiment, the flow of the working fluid and the heat transfer mechanism within the heat pipe 112 are illustrated by arrows 166 and 168. Arrows 166 pointing toward the second surface 142 illustrates illustrate the working fluid in a vapor or gas state traveling in the vapor channels 156 toward the second surface 142. Arrows 168 pointing toward the first surface 140 illustrate the working fluid in a liquid state traveling within the columns 154 of wicking material 152 toward the first surface 140.

As heat 160 is received at the first surface 140, the working fluid absorbs the heat 160 and transitions from the liquid state to the vapor or gaseous state. In accordance with the physics of phase transitions, a relatively large amount of heat is needed for a material to transition from the liquid state that the gaseous state. Accordingly, the working fluid absorbs a large amount of heat in transitioning between the liquid state and the gaseous state at the receiving area or the hot surface corresponding to the first surface 140.

In one embodiment, after the working fluid has transitioned to the gaseous state, the working fluid flows through the channels 156 toward the second surface 142. This direction of flow for the gaseous working fluid is a result of a pressure difference within the vapor chamber. The pressure is higher at the receiving area. The pressure is lower at the heat dissipation area. This is based in part on the fact that the working fluid becomes a liquid at the heat dissipation area, as will be described in more detail below.

In one embodiment, as the gaseous working fluid approaches the second surface 142 within the vapor channels 156, the gaseous working fluid begins transferring heat to the second surface 142. After working fluid has transferred a sufficient amount of heat, the working fluid transitions from the vapor or gas state to the liquid state. A large amount of heat dissipation is needed to transition from the gaseous state to the liquid state. Accordingly, the working fluid transfers a large amount of heat energy transitioning to the liquid state. Heat 162 is that dissipated from the second surface 142.

In one embodiment, when the working fluid transitions to the liquid state at the exterior surface 162, the working fluid is absorbed by the wicking material 152 in the columns 154. Liquid working fluid is absorbed by wicking material 152 via capillary action. The liquid working fluid then flows through the wicking material of the columns 154 toward the first surface 140. When the liquid working fluid arrives at the first surface 140, the liquid working material absorbs heat 160 and transitions to the vapor or gas state and the cycle of heat absorption dissipation repeats. In this way, the flat vapor chamber type heat pipe 112 can transfer a large amount of heat from one side of the heat pipe 112 to the other.

As described above, in one embodiment, the wall 116 can include a pipe 112 as shown in FIGS. 3A and 3B. In particular, the wall 116 can include a flat vapor chamber type heat pipe 112 that can transfer large amounts of heat from the interior volume 103 of the semiconductor process chamber 102 and exterior of the semiconductor process chamber 102. Other types of heat pipes than those described above can be utilized without departing from the scope of the present disclosure. Furthermore, other components of a semiconductor process chamber can include heat pipes without departing from the scope of the present disclosure.

Figure 4A:
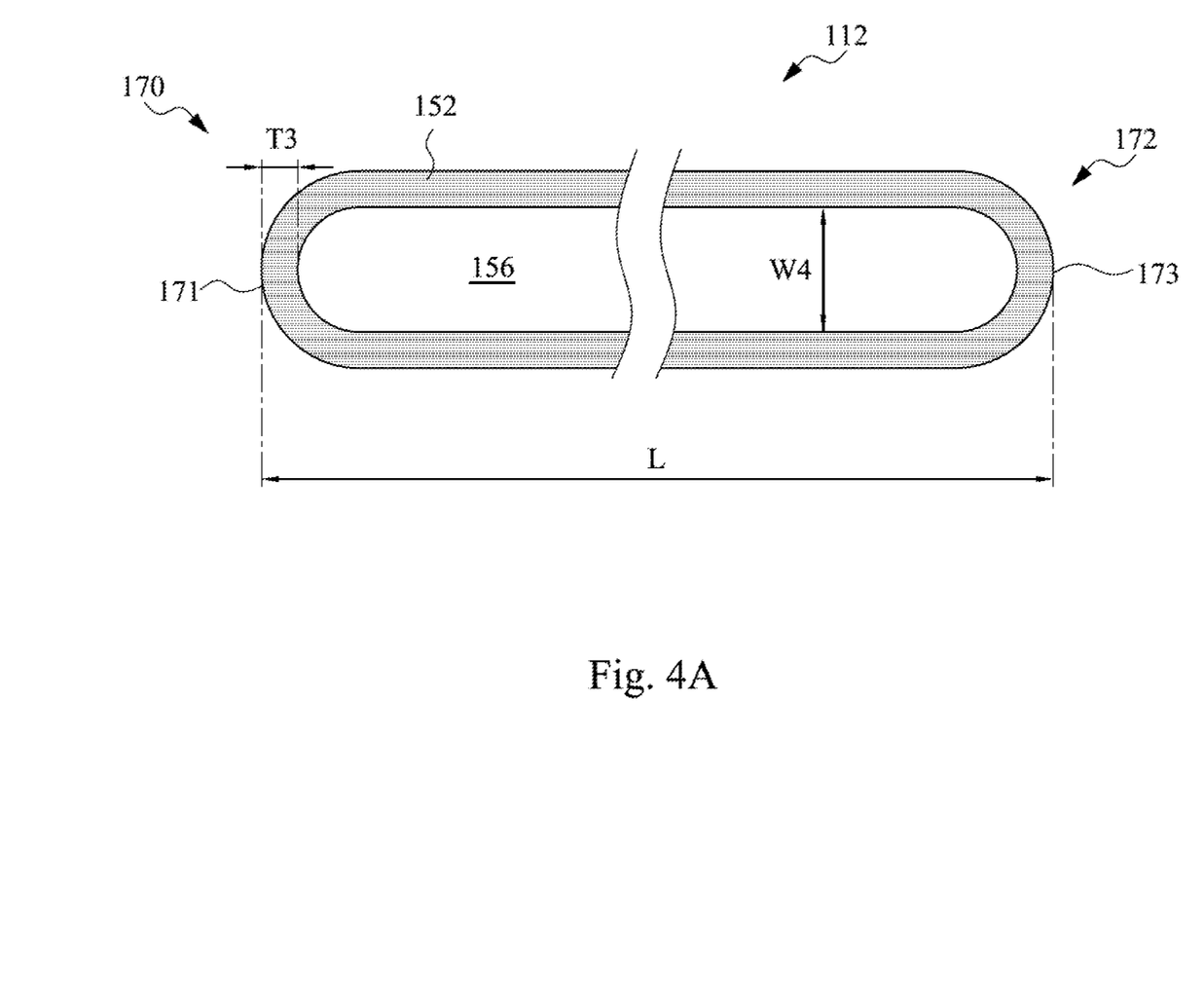
FIGS. 4A and 4B are illustrations of a heat pipe, in accordance with some embodiments.

FIG. 4A is a cross-sectional view of a discrete heat pipe 112, according to one embodiment. The heat pipe 112 is formed as a single pipe type heat pipe 112, according to one embodiment. The heat pipe 112 of FIG. 4A can be included as a portion of processing equipment 104 of the semiconductor process chamber 102. The heat pipe 112 can be positioned adjacent to and can transfer heat from the processing equipment 104 of the semiconductor process chamber 102. In one embodiment, the heat pipe 112 physically supports a positioning of processing equipment 104 within the semiconductor process chamber 102. Those of skill in the art will recognize, in light of the present disclosure, that a heat pipe 112 can be utilized in many ways and in conjunction with many components within a semiconductor process chamber 102 without departing from the scope of the present disclosure. The heat pipe 112 can be placed in an environment in which the heat pipe receives heat at a heat receiving area or hot surface 170 and in which the heat pipe 112 dissipates heat at a heat dissipation area or cool surface 172.

In one embodiment, the heat pipe 112 can be positioned between the deposition shield 120 and the wall 116. In this example, the heat receiving area or hot surface 170 is the exterior surface 142 of the deposition shield 120. The heat dissipation area or cool surface 172 is the interior surface of the wall 116. In this example, the heat pipe 112 can be positioned below the heater pad 111a between the deposition shield 120 and the wall 116. The heat pipe 112 receives heat from the exterior surface 142 of the deposition shield 120 and dissipates the heat to the wall 116. In this way, the heat pipe 112 can facilitate the dissipation of heat from the interior of the processing chamber to the exterior of the processing chamber. In one embodiment, a plurality of discrete heat pipes 112 can be placed between the deposition shield 120 and the wall 116. The heat pipe 112 can be placed in other locations to facilitate dissipation of heat from the interior of the processing chamber to the exterior of the processing chamber.

In one embodiment, the heat pipe 112 divides an internal vapor channel 156 and includes a wicking material 152 positioned along internal surfaces of the heat pipe 112. The wicking material 152 is configured to draw in liquid via capillary action. Once inside the wicking material 152, the liquid can travel through the wicking material 152, as will be described in more detail below.

In one embodiment, the wicking material 152 is a sintered material. The sintered material may be a sintered metal. The sintered metal may include titanium, aluminum, iron, copper, or other types of metal. The sintered metal includes pores that can draw in liquids via capillary effect. The liquid can travel along the sintered metal through a network of pores. The sintered metal can be produced by generating a powder from the metal and impressing the metal powder together at temperatures lower than the melting point of the metal. The result is a porous metal that can draw in liquid via capillary action. Other materials and processes can be used for a sintered material without departing from the scope of the present disclosure.

In one embodiment, the wicking material 152 is a grooved material. The grooves can draw in liquid by capillary action. The liquid can then travel along the length of the grooves. The grooved material can include metals such as titanium, aluminum, copper, iron, or other types of metal. The grooved material can include other types of metal or materials other than metal without departing from the scope of the present disclosure. The grooved material may also be a sintered material.

In one embodiment, the wicking material 152 includes wrapped screens. In this case, the wicking material includes screens that have a large number of pores. The screens are then wrapped up. The screens can draw in liquid via capillary action. Once inside the wicking material, the liquid can travel through a network of pores or apertures. The wicking material 152 can include other types of wicking material other than screens, sintered material, or grooved material without departing from the scope of the present disclosure.

In one embodiment, the heat pipe 112 includes a working fluid in the vapor chamber between the first surface 140 and the second surface 142. During operation of the heat pipe 112, the working fluid repeatedly transitions between gaseous and liquid states while circulating through the interior between the heat receiving area 170 and the heat dissipation area 172. The working fluid can be selected based on the expected temperature range in the environment in which the heat pipe 112 will be placed. In one embodiment, for temperature ranges between −70° C. and 200° C., the working fluid can include water, Freon, $NH_3$, $CH_3COCH_3$, $CH_3OH$, $C_2H_5OH$, and $C_7H_{16}$. In one embodiment, for temperature ranges between 200° C. and 500° C., the working fluid can include naphthalene, Downtherm, Thermex, sulfur, and mercury. In one embodiment, for temperature ranges between 500° C. and 1000° C., the working fluid can include Cs, Rb, Kalium, and sodium. Other working fluids than those set forth above can be utilized for the various temperature ranges without departing from the scope of the present disclosure.

In one embodiment, the heat pipe 112 has a length L. The length corresponds to the distance between a first end 171 and a second end 173. The first end 171 is positioned at the heat receiving area or surface 170. The second end 173 is positioned at the heat dissipation area or surface 172. The length L can be between 10 mm and 30 mm, though other lengths are possible without departing from the scope of the present disclosure. The wicking material can have a thickness T3. The thickness T3 can have a value between 1 mm and 5 mm, though other thicknesses are possible without departing from the scope of the present disclosure. The interior vapor channel 156 can have a width W4. The width W4 can have a value between 3 mm and 10 mm, though other values can be utilized without departing from the scope of the present disclosure.

Figure 4B:
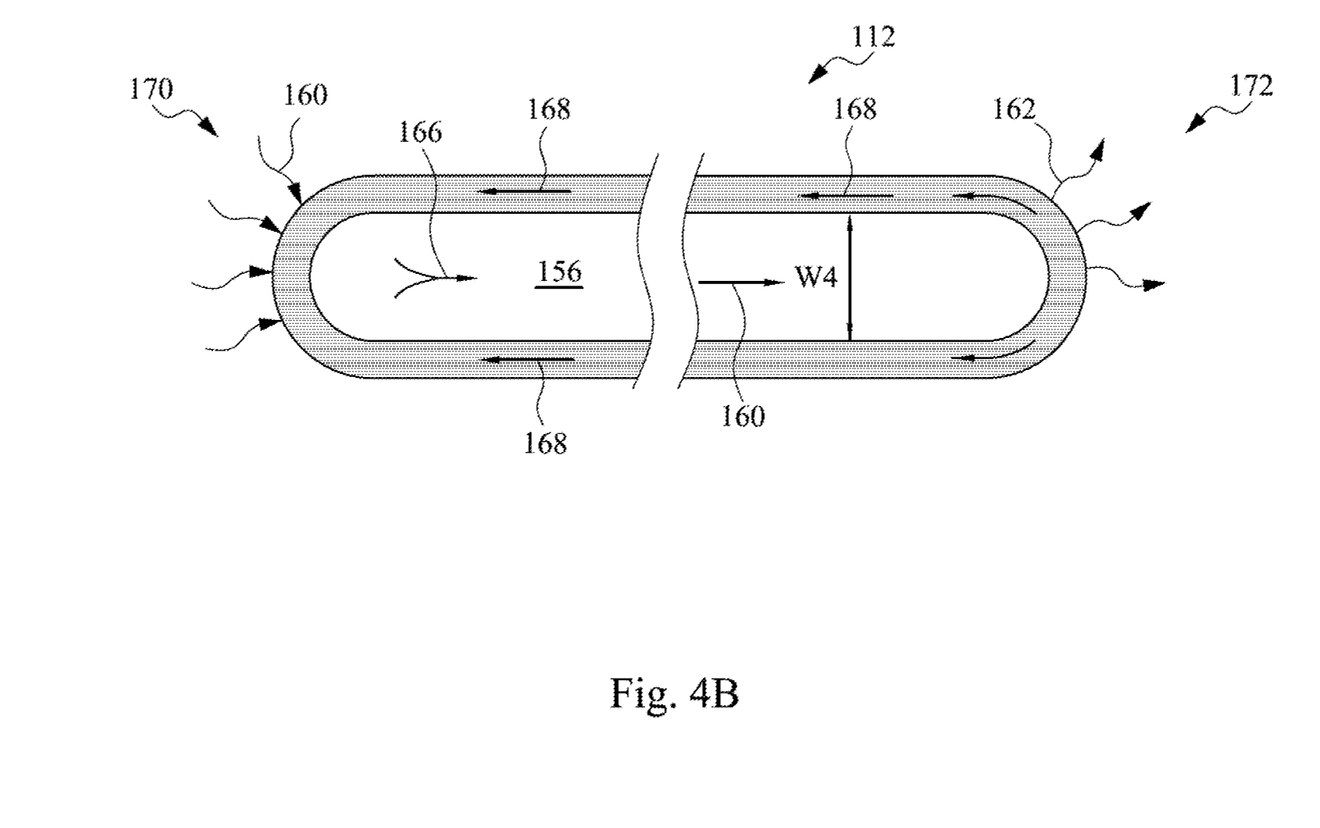

FIG. 4B is an annotated view of the heat pipe 112 of FIG. 4A illustrating operation of the heat pipe, according to one embodiment. In one embodiment, heat 160 received by the heat pipe 112 is illustrated as wavy lines incident on the first surface 140 of the heat pipe 112. The heat pipe 112 absorbs the heat 160. Heat 162 dissipated by the heat pipe 112 is illustrated as wavy lines exiting the second surface 142.

In one embodiment, the flow of the working fluid and the heat transfer mechanism within the heat pipe 112 are illustrated by arrows 166 and 168. Arrows 166 pointing toward the heat dissipation area 172 illustrate the working fluid in a vapor or gas state traveling in the vapor channel 156 toward the heat dissipation area 172. Arrows 168 pointing toward the heat receiving area 170 illustrate the working fluid in a liquid state traveling within the wicking material 152 toward the heat receiving area 170.

As heat 160 is received at the heat receiving area, the working fluid absorbs the heat 160 and transitions from the liquid state to the vapor or gaseous state. In accordance with the physics of phase transitions, a relatively large amount of heat is needed for a material to transition from the liquid state to the gaseous state. Accordingly, the working fluid absorbs a large amount of heat in transitioning between the liquid state and the gaseous state at the receiving area of the hot surface 170.

In one embodiment, after the working fluid has transitioned to the gaseous state, the working fluid flows through the vapor channel 156 toward the heat dissipation area 172. This direction of flow for the gaseous working fluid is a result of a pressure difference within the vapor chamber. The pressure is higher at the heat receiving area 170. The pressure is lower at the heat dissipation area 172. This is based in part on the fact that the working fluid becomes a liquid at the heat dissipation area, as will be described in more detail below.

In one embodiment, as the gaseous working fluid approaches the heat dissipation area 172 within the vapor channel 156, the gaseous working fluid begins transferring heat to the second surface 142. After the working fluid has transferred a sufficient amount of heat, the working fluid transitions from the vapor or gas state to the liquid state. A large amount of heat dissipation is needed to transition from the gaseous state to the liquid state. Accordingly, the working fluid transfers a large amount of heat energy transitioning to the liquid state. Heat 162 is that dissipated at the heat dissipation area 172.

In one embodiment, when the working fluid transitions to the liquid state at the heat dissipation area 172, the working fluid is absorbed by the wicking material 152. Liquid working fluid is absorbed by wicking material 152 via capillary action. The liquid working fluid then flows through the wicking material 152 toward the heat receiving area. When the liquid working fluid arrives at the heat receiving area, the liquid working material absorbs heat 160 and transitions to the vapor or gas state and the cycle of heat absorption dissipation repeats. In this way, the flat vapor chamber type heat pipe 112 can transfer a large amount of heat from one side of the heat pipe 112 to the other.

Figure 5:
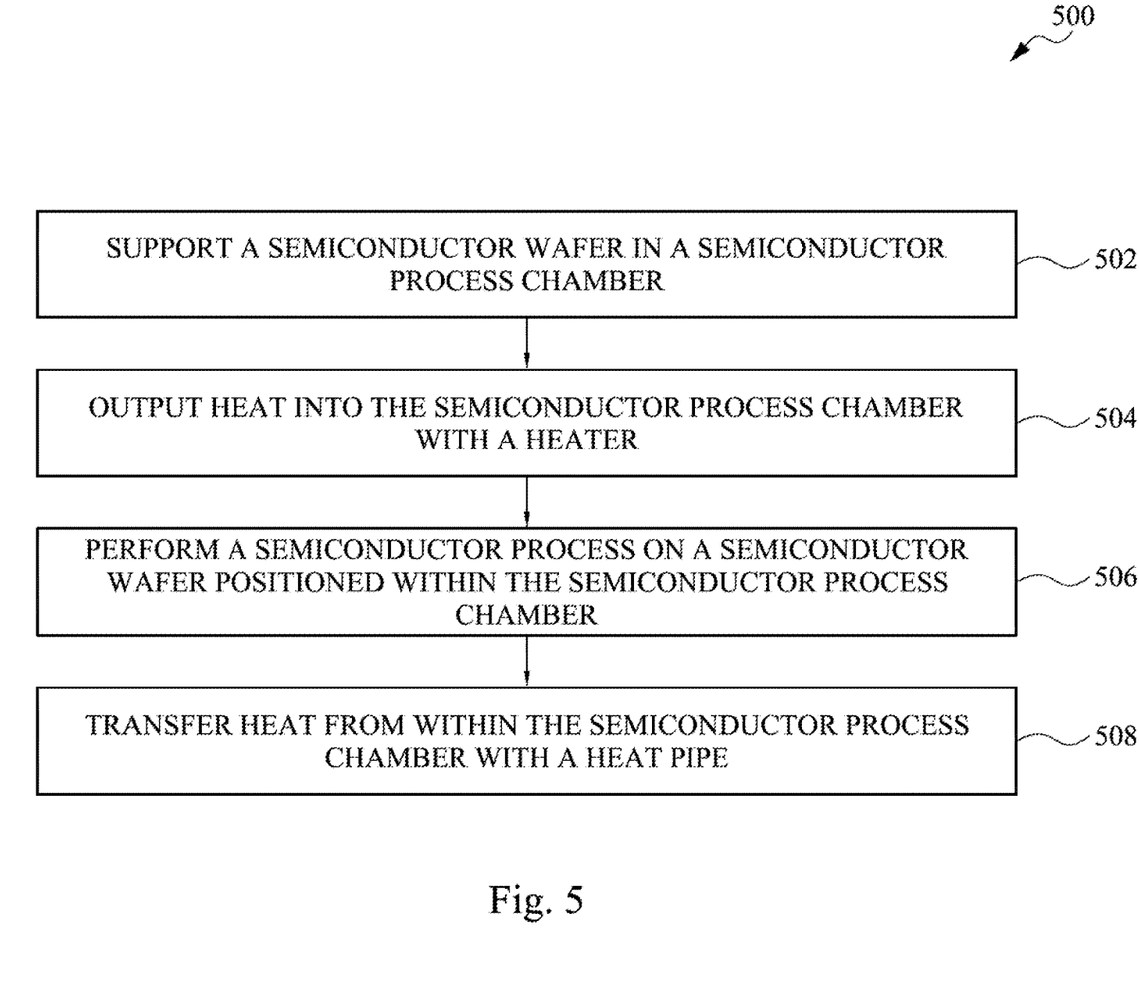
FIG. 5 is a flow diagram of a method for processing a semiconductor wafer, in accordance with some embodiments.

FIG. 5 is a flow diagram of a method 500, according to one embodiment. At step 502, the method 500 includes supporting a semiconductor wafer in a semiconductor process chamber. One example of a semiconductor process chamber is the semiconductor process chamber 102 of FIG. 1. At step 504, the method 500 includes outputting heat into the semiconductor process chamber with a heater. One example of a heater is the heater 108 of FIG. 1. At step 506, the method 500 includes performing a semiconductor process on a semiconductor wafer positioned within the semiconductor process chamber. At step 508, the method 500 includes transferring heat from within the semiconductor process chamber with a heat pipe. One example of a heat pipe is the heat pipe 112 of FIG. 3A.

In one embodiment, a semiconductor process chamber includes a heater, a wall defining an interior volume, a chuck positioned in the interior volume and configured to hold one or more semiconductor wafers, and a deposition shield positioned in the interior volume. The deposition shield includes a first surface, a second surface, and a heat pipe vapor chamber positioned between the first surface and the second surface.

In one embodiment, a semiconductor processing system includes a semiconductor process chamber defining an interior volume and a chuck positioned within the semiconductor process chamber and configured to hold a semiconductor wafer during a semiconductor process. The system includes a heater positioned to heat the interior volume and a heat pipe positioned to receive heat from the interior volume.

In one embodiment, a method includes supporting a semiconductor wafer in a semiconductor process chamber and outputting heat into the semiconductor process chamber with a heater. The method includes performing a semiconductor process on a semiconductor wafer positioned within the semiconductor process chamber and transferring heat from within the semiconductor process chamber with a heat pipe.

Principles of the present disclosure provide enhanced temperature control in a semiconductor processing environment. Reliable control of the temperature in the semiconductor processing environment results in semiconductor wafers with characteristics that comply with design specifications. Furthermore, reliable temperature control results in uniformity in characteristics of integrated circuits diced from the semiconductor wafers. Accordingly, integrated circuits have reliable performance and few wafers and integrated circuits will be scrapped due to poor temperature control. The heat pipes implemented in the semiconductor processing environments, as described herein, enable enhanced dissipation of heat from the semiconductor processing environments. This results in better control of temperatures within the semiconductor processing environments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor process system, comprising:
   a heater;
   a wall defining an interior volume;
   a wafer support positioned in the interior volume and configured to hold one or more semiconductor wafers; and
   a deposition shield positioned in the interior volume and including:
      a first surface;
      a second surface; and
      a heat pipe vapor chamber positioned between the first surface and the second surface.

2. The semiconductor process chamber of claim 1, wherein the heat pipe vapor chamber includes:
   a wicking material;
   one or more channels; and
   a working fluid.

3. The semiconductor process chamber of claim 1, wherein the heat pipe vapor chamber includes one or more posts extending between the first surface and the second surface.

4. The semiconductor process chamber of claim 3, wherein the wicking material is coupled to the one or more posts.

5. The semiconductor process chamber of claim 2, wherein the wicking material is a sintered wicking material.

6. The semiconductor process chamber of claim 2, wherein the wicking material is a grooved wicking material.

7. The semiconductor process chamber of claim 2, wherein the wicking material includes one or more screens.

8. The semiconductor process chamber of claim 2, wherein the wicking material is metal.

9. The semiconductor process chamber of claim 1, wherein the deposition shield surrounds the chuck, wherein the first surface of the deposition shield is closer to the chuck than is the second surface of the deposition shield.

10. A semiconductor processing system, comprising:
    a semiconductor process chamber defining an interior volume;
    a wafer support positioned within the semiconductor process chamber and configured to hold a semiconductor wafer during a semiconductor process;
    a heater positioned to heat the interior volume; and
    a heat pipe positioned to receive heat from the interior volume.

11. The semiconductor processing system of claim 10, further comprising:
    a temperature sensor configured to sense a temperature within the interior volume; and
    a control system coupled to the temperature sensor and the heater and configured to control the heater responsive to the temperature sensor.

12. The semiconductor processing system of claim 10, wherein the heat pipe is positioned within the interior volume.

13. The semiconductor processing system of claim 10, further comprising processing equipment positioned within the interior volume and coupled to the heat pipe.

14. The semiconductor processing system of claim 10, wherein the semiconductor process chamber includes a wall at least partially defining the interior volume, wherein the heat pipe is integrated with the wall.

15. The semiconductor processing system of claim 14, wherein the heat pipe is a flat vapor chamber type heat pipe.

16. The semiconductor processing system of claim 10, wherein the semiconductor process chamber includes one or more of:
    a thin film deposition chamber;
    a thin film etching chamber; and
    an ion implantation chamber.

17. The semiconductor processing system of claim 10, wherein the heat pipe includes:
    a hermetically sealed interior chamber;
    a wicking material positioned in the interior chamber; and
    a working fluid positioned in the interior chamber.

18. A method, comprising:
    supporting a semiconductor wafer in a semiconductor process chamber;
    outputting heat into the semiconductor process chamber with a heater;
    performing a semiconductor process on a semiconductor wafer positioned within the semiconductor process chamber; and transferring heat from within the semiconductor process chamber with a heat pipe.

19. The method of claim 18, wherein the heat pipe is integrated with a deposition shield positioned within the semiconductor process chamber.

20. The method of claim 18, wherein the heat pipe includes:
- an interior volume;
- a wicking material positioned in the interior volume; and
- a working fluid.

* * * * *